(12) United States Patent
Kamp et al.

(10) Patent No.: US 7,509,561 B2
(45) Date of Patent: Mar. 24, 2009

(54) PARITY CHECKING CIRCUIT FOR CONTINUOUS CHECKING OF THE PARITY OF A MEMORY CELL

(75) Inventors: Winfried Kamp, München (DE); Siegmar Köppe, München (DE)

(73) Assignee: Infineon Technologies AG, Munich (DE)

( * ) Notice: Subject to any disclaimer, the term of this patent is extended or adjusted under 35 U.S.C. 154(b) by 286 days.

(21) Appl. No.: 11/063,953

(22) Filed: Feb. 23, 2005

(65) Prior Publication Data

US 2005/0204274 A1    Sep. 15, 2005

(30) Foreign Application Priority Data

Feb. 23, 2004    (DE) ............... 10 2004 008 757

(51) Int. Cl.
*H03M 13/00* (2006.01)
(52) U.S. Cl. .................................... 714/773
(58) Field of Classification Search ............... 714/773
See application file for complete search history.

(56) References Cited

U.S. PATENT DOCUMENTS

| | | | | |
|---|---|---|---|---|
| 5,184,325 A | * | 2/1993 | Lipovski ............... | 365/189.07 |
| 5,200,963 A | * | 4/1993 | Chau et al. ............ | 714/820 |
| 5,264,738 A | * | 11/1993 | Veendrick et al. ...... | 327/203 |
| 5,434,871 A | * | 7/1995 | Purdham et al. ........ | 714/805 |
| 5,450,426 A | * | 9/1995 | Purdham et al. ........ | 714/820 |
| 5,694,406 A | * | 12/1997 | Lipovski ............... | 714/805 |
| 5,777,608 A | * | 7/1998 | Lipovski et al. ....... | 345/519 |

FOREIGN PATENT DOCUMENTS

JP    07006046 A    1/1995

* cited by examiner

*Primary Examiner*—Joseph D Torres
(74) *Attorney, Agent, or Firm*—Brinks Hofer Gilson & Lione

(57) ABSTRACT

A parity checking circuit is designed for continuous parity checking of content-addressable memory cells, and is configured such that during a parity check the number of parity checking steps per data word is the same as the number of bits in the original payload data word to be stored, with the parity checking circuit being formed from four transistors of the same conductance type. The parity checking circuit has a detector, which automatically detects the change in an information state of a memory cell. The detector is in the form of an automatic state device and has a number of catch latches.

20 Claims, 8 Drawing Sheets

PARITY CHECKING CIRCUIT FOR CONTINUOUS CHECKING OF THE PARITY OF A MEMORY CELL

PRIORITY

This application claims the benefit of priority to German Patent Application 10 2004 008 757.1, filed on Feb. 23, 2004, herein incorporated by reference in its entirety.

TECHNICAL FIELD

The invention relates to a parity checking circuit which is electrically connected to the memory cells in a memory cell array and is designed for continuous checking of the parity of the memory cells.

BACKGROUND

The components, such as semiconductor memories, in circuits which are produced using modern microelectronics are becoming ever smaller, and the packing density of the components is becoming ever higher. Furthermore, the charge which is stored in memory components, and which is stored as a data item, is minimal. The data which is stored in the memory components is therefore sensitive to interference. When data is being stored in RAMs, two different types of fault may occur: permanent errors or volatile errors. Permanent errors, which are referred to as hard errors, are caused by defects in the memory ICs themselves or in the drive circuits that are involved. Volatile errors, which are referred to as soft errors, occur only randomly, and are therefore not reproducible. They are caused mainly by alpha radiation. Alpha radiation can reverse the charge of memory capacitors in dynamic RAMS, or else memory flip flops in static RAMS can flip. Volatile errors may also be caused by interference pulses which are produced within or outside the circuit.

The occurrence of memory errors may have far-reaching consequences. For example, a single error in a computer memory can not only cause an incorrect result, but can lead to total failure of the program. In order to avoid such failures and adverse effects, errors such as these must be identified and reported.

One method for error identification is to store one or more checking bits in addition to the data bits. The greater the number of checking bits which are also stored, the more errors can be identified or even corrected.

One procedure for error identification is to transmit a so-called parity bit. This error identification method is referred to as parity checking. Even or odd parities may be agreed. In the case of even parity, the added parity bit is set to zero when the number of ones in the data word is even. The parity bit is set to one when the parity is odd. In consequence, the total number of transmitted ones in a data word including the parity bit is always even. In the case of odd parity, the total number is always odd.

In future technologies, finer structures and the smaller capacitances associated with them will result even more frequently in such soft errors, as mentioned above, in storage circuits. When a parity bit is read, the parity of the data word is recalculated, and is then compared with the parity bit which has likewise been read. If they are the same, the data word has not been changed, and is thus correct. If they are not the same, on the other hand, the data word is incorrect, since at least one bit must have been changed. This procedure, of recalculating the parity on reading and comparing it with the stored value, works for all memories whose data is processed further or assessed only when it is read. However, there are also memory configurations whose contents are read continuously, as is the case by way of example for the coefficients of filter modules in configuration memories. This is likewise the case with memories whose content is searched sporadically, as is done, by way of example, in the case of content-addressable memories (CAMs), which are used as caches.

U.S. Pat. No. 5,434,871 discloses a memory cell arrangement in which continuous parity checking is carried out. The circuit arrangement is designed such that each memory cell is electrically connected to a parity checking circuit. Each parity checking circuit continuously checks the binary memory state of the associated memory cell. The states of the memory cells are joined together in order to make it possible to carry out a parity check for a given data arrangement. Each parity checking circuit has six transistors, in which case, as a result of the design of the parity checking circuit, five transistors are of a first conductance type, and one transistor is of a second conductance type. The parity checking circuit is designed such that one transistor in each case reads the memory state in one of the two memory nodes of the associated memory cell, and these two transistors use a logic EXCLUSIVE-OR operation to link the parity of the associated memory cell to the parity of the previous memory cell. The remaining four transistors in the parity checking circuit are connected such that they transmit to the downstream memory cell the parity result which results from the logic operation, and its complementary parity result. The design of the known parity checking circuit is relatively complex and, owing to the relatively large number (six) of transistors, it requires a relatively high degree of circuit complexity. Furthermore, transistors of both a first and second conductance type are used. This has a considerable disadvantage in the layout design, since separations which are required on the basis of the known rules for CMOS production processes must be complied with and, in the present case, with the required configuration of transistors of a different conductance type, this leads to a considerable space requirement. A further disadvantage of the known parity checking circuit is that, effectively, one diode is used which on average results in a latent parallel current between the supply voltage potential and the ground potential in every alternate memory cell (assuming an equal distribution of logic "0" and "1" states stored in the memory cells) and a constant power loss is produced as a result. Furthermore, one major disadvantage of the known parity checking circuit is that parity checking information must be externally calculated and stored in advance for the parity check. Furthermore, the previous calculation of the parity checking information (parity bit) and the storage of M+1 bits are always used for parity checking, where M indicates the number of bits in a payload data word. This means that the data word length is always used for parity checking. The number of parity checking stages M+1 is thus always greater than the data word length M. This procedure and the fundamental circuit design are highly complex and relatively costly since, inter alia, a relatively large amount of space is required for the circuit.

BRIEF SUMMARY

A parity checking circuit is provided which allows continuous parity checking in a simple and reliable manner and which can be produced with little complexity and at low cost. The parity checking circuit permits reliable, rapid and early error identification for memory cells in a memory cell array.

A parity checking circuit according to one embodiment of the invention is electrically connected to a memory cell in a memory cell array and is designed for continuous checking of the parity of the memory cell. The parity checking circuit is designed such that, during a parity check, the number N of parity checking stages per data word is equal to the number M of bits in the original payload data word to be stored. Continuous parity checking can thus be carried out quickly and reliably, a fault can be detected immediately, and a stored data item can be identified without any delay as being invalid. The parity checking circuit may be memory cells whose content is read all the time, or whose content is searched sporadically. Considerably better parity checking and error identification can thus be carried out, particularly in the case of content-addressable memory cells (CAM memory cells) or configuration memories. The on-line detection of the error in the case of memory cells which are assessed all the time ensures that a possible malfunction of an overall system is identified at an early stage, and that appropriate measures can be initiated. Continuous parity checking can be carried out without the previous external calculation of parity checking information, and its storage. Furthermore, it is possible that the payload data word length is not increased for the parity check, so that the circuit complexity, and hence the space requirement and the costs for the circuit, can be considerably reduced.

The parity checking circuit may be formed from four transistors of the same conductance type. This makes it possible to produce a parity checking circuit with little complexity and in a space-saving manner. The use of transistors of only one conductance type allows the layout design to be considerably simplified. The component complexity of each parity checking circuit may be considerably reduced. The parity checking circuit also allows the constant power loss to be reduced considerably, in comparison to the prior art.

In one embodiment, the gate connections of the four transistors are each electrically connected to the memory cell which is electrically connected to the parity checking circuit. All four transistors are thus driven by the outputs of the associated memory cell, and it is possible to ensure an effective circuit concept for the components in the parity checking circuit. This allows an implementation with fewer components, whose required chip surface error is thus minimized.

In another embodiment, the four transistors may be cross-coupled. This allows particularly simple circuitry.

The gate connections of a first and of a second transistor in the parity checking circuit are preferably electrically connected to a first memory node in the memory cell, and the gate connections of a third and of a fourth transistor are preferably electrically connected to a second memory node in the associated memory cell. This makes it possible for two transistors to in each case be controlled by the output signal from one of the two outputs of the memory cell.

Another embodiment of the parity checking circuit can be achieved by a current path through a first transistor being connected between a first parity input and a second parity output, and by a current path through a second transistor being connected between a second parity input and a first parity output. In this case, it is possible to provide for the source connection of the first transistor to be electrically connected to a first parity input, and for its drain connection to be electrically connected to a second parity output of the parity checking circuit. It is also possible to provide for the source connection of the second transistor to be electrically connected to a second parity input, and for its drain connection to be electrically connected to a first parity output of the parity checking circuit.

In another embodiment, the current path through a third transistor can be connected between a second parity input and a second parity output, and the current path through a fourth transistor can be connected between a first parity input and a first parity output. The source connection of the third transistor is preferably electrically connected to the second parity input, and its drain connection is preferably electrically connected to the second parity output of the parity checking circuit. The circuitry for the parity checking circuit can also be designed in such a way that the source connection of the fourth transistor is electrically connected to a first parity input, and its drain connection is electrically connected to a first parity output of the parity checking circuit. The drain connection of the first transistor can be electrically connected to the drain connection of the third transistor, and the source connection of the first transistor can be electrically connected to the source connection of the fourth transistor. Furthermore, the drain connection of the second transistor can be electrically connected to the drain connection of the fourth transistor, and the source connection of the second transistor can be electrically connected to the source connection of the third transistor. The individual circuitries and connections of the transistors in the parity checking circuit to one another and to the inputs and outputs of the parity checking circuit allow the layout and the circuit design of the parity checking circuit to be improved in many ways. An optimum parity checking circuit design can be achieved by the combination of the above embodiments. Particularly in this case, the parity checking circuit is optimized in terms of economic and minimized continuous checking of the parity, and likewise optimized with respect to the speed and reliability of the checking.

Another embodiment has a detector which detects the change in an information state of a memory cell, in particular detects two stages dynamically. It is also possible to provide for the detector to be designed such that a joint check of a large number of memory cells can be carried out, in which case this check can be carried out irreversibly. The detector makes it possible to avoid calculating parity checking information in advance because the parity checking information can be calculated automatically by means of the detector. The on-line detection can thus be carried out particularly effectively. Optimized continuous parity checking can thus be implemented bearing in mind speed and reliability. The space requirement, and hence the costs as well, can thus also be considerably reduced in this way.

In one embodiment, the detector may be an automatic state device which has a first state class which characterizes the initialization state, has a second state class which characterizes normal operation, and has a third state class which characterizes an error. It is possible to provide for the detector to be designed such that a change from one state class to another state class is irreversible. This allows particularly simple and reliable error identification. For example, it is possible to provide for the initialization state to be characterized by a state of two logic "0" states. Normal operation can be characterized, for example, by the states "01" and "10". Furthermore, an error can be characterized by the state "11". If a change is made from the initialization state, the first state class, to normal operation, this process is irreversible. A change back to the initialization state takes place only by resetting being explicitly carried out. A change from normal operation, the second state class, to an error, the third state class, is likewise irreversible. These statements are only by way of example, and the method of operation of the detector can be implemented flexibly and in many ways. It is possible to provide for the detector to have at least two catch latches.

The catch latches may each have four transistors and at least one inverter, with at least one first transistor and one second transistor in a catch latch being of a first conductance type. The gate connection of the first transistor in a catch latch is preferably electrically connected to the input, its source connection is preferably electrically connected to ground potential, and its drain connection is preferably electrically connected to a first circuit node in the catch latch. The source connection of the second transistor in a catch latch can be electrically connected to the first circuit node in the catch latch, its gate connection can be electrically connected to a second circuit node in the catch latch, and its drain connection can be electrically connected to ground potential. One input of the first inverter is preferably electrically connected to the first circuit node, and one of its outputs is electrically connected via the second circuit node to the output of the catch latch.

It is also possible to provide for the third and the fourth transistor in a catch latch to be of the opposite conductance type to the first and the second transistor. The gate connection of the third transistor may be electrically connected to the control line for resetting the parity checking circuit, its source connection can be electrically connected to the supply voltage potential, and its drain connection can be electrically connected to a first circuit node. Furthermore, the gate connection of the fourth transistor can be electrically connected to a second circuit node, its source connection can be electrically connected to a first circuit node, and its drain connection can be electrically connected to the supply voltage potential.

It is also possible to provide in the circuit design for a catch latch for the third and the fourth transistor in a catch latch of the same conductance type as the first and the second transistor. Further circuitry for the components in a catch latch can provide for the gate connection of the third transistor to be electrically connected to the control line for resetting the parity checking circuit, for its source connection to be electrically connected to a first circuit node, and for its drain connection to be electrically connected to the supply voltage potential. Furthermore, the gate connection of the fourth transistor can be electrically connected in a preferred manner to one output of a second inverter, its source connection can be electrically connected to the supply voltage potential, and its drain connection can be electrically connected to a first circuit node. The input of the second inverter can be electrically connected to the second circuit node.

The outputs of the detector are connected to a logic circuit, with the logic circuit being designed such that the output signals of the detector are reduced to a 1-bit signal. This makes it possible to evaluate the signals as simply and with as little complexity as possible.

It is possible to provide for the outputs of the catch latches to be electrically connected to a first AND gate for evaluation of the output signals.

It should be noted that the AND gate is arranged in the circuit by way of example in one embodiment and, in particular, is designed for the detector coding as explained above by way of example (initialization state "00"; normal operation "01" and "10"; error "11"). The logic components to which the outputs of the detector, in particular of the catch latches, are electrically connected are designed independently of the detector coding. The logic components may thus, for example, also be NAND gates or NOR gates. It is also possible to provide for the detector to be coded in such a way that the states of initialization, normal operation and error are characterized by more than two bits. The catch latches may allow particularly effective as well as fast and reliable signal processing of the signals received by the first and the second parity outputs, by means of one or more of the stated circuit design configurations. Furthermore, the circuit of a catch latch is designed to occupy as little space as possible. The relatively small number of components that a catch latch has furthermore allows a relatively cost-effective implementation.

A further embodiment relates to a data storage apparatus which has a parity checking circuit.

The data storage apparatus may have a memory cell array with a number of memory cells.

The memory cells may be in the form of CMOS-SRAM memory cells, in particular content-addressable memory cells. Each of the memory cells in the memory cell array is electrically connected to one of the parity checking circuits. This allows reliable and fast continuous parity checking of the memory cells throughout the entire memory cell array. Furthermore, the chip area that is required can be considerably reduced, since the generally very large number of memory cells mean that the same number of parity checking circuits are also required, in a corresponding manner, and the area of each individual parity checking circuit is considerably smaller than that of the parity checking circuit that is known from the prior art.

Furthermore, it is possible to provide for a second parity input of a first parity checking circuit to be electrically connected to a second parity output of the upstream parity checking circuit, and for a first parity input of the first parity checking circuit to be electrically connected to a first parity output of the upstream parity checking circuit. The memory cells, which are generally arranged in the form of a matrix, may thus be connected to one another in a simple manner both horizontally (rows) or else vertically (columns) in order to carry out better continuous parity checking—horizontally or vertically—on all of the memory cells in a column or a row.

It is possible to provide for the first parity output and the second parity output of a parity checking circuit each to be electrically connected to a precharge transistor. This makes it possible to ensure that resetting of the parity checking circuit during a writing process of the associated memory cell can be supported.

The precharge transistors may be of the opposite conductance type to the conductance type of the transistors in the parity checking circuit. However, it is also possible to provide for the precharge transistors to be of the same conductance type as the transistors in the parity checking circuit. This allows the precharge transistors to be designed flexibly without any adverse effect on the circuit design of the parity checking circuit, and to be easily matched to the requirements for the further circuitry with the chip components and the corresponding voltage potentials.

As already stated, the memory cells may be arranged in the form of a matrix. In this case, it is possible to provide for the first memory cell in a row and/or a column to be electrically connected by means of a second input, in particular the complementary parity input, to a supply voltage potential. It is also possible to provide for a first input of this first memory cell, in particular the first parity input, to be electrically connected via a transistor, in particular an n-channel transistor, to ground potential. It is also possible to provide for the gate connection of this transistor to be connected to the control line for resetting the parity checking circuit.

Furthermore, when the memory cells are arranged in the form of a matrix, it is possible to provide for the last memory cell in a row and/or a column to be electrically connected by means of a first output, in particular the second parity output, to a first input of a first catch latch, and to be electrically connected by means of a second output, in particular the first parity output, to a first input of a second catch latch. This allows continuous parity checking of all the memory cells in a row or a column, and thus throughout an entire stored word, and allows the output signals to be checked simply and reliably by means of the catch latches at the end of such a row or column.

The first and the second detector outputs of a memory cell block may in one embodiment be connected in a parallel cascaded form to the corresponding outputs of the other memory cell blocks in the memory cell array. It is also possible to provide for the first and the second detector outputs of each memory cell block each to be electrically connected to an AND gate. It is also possible to provide for the capability to cascade a number of memory cell blocks in parallel. It is possible to provide for the memory cell blocks to be connected to one another such that they are cascaded in parallel. Each memory cell block may have a number of memory cells with correspondingly associated parity checking circuits.

It is also possible to provide for the outputs of a detector in a memory cell block to be electrically connected to a further logic circuit, in particular to a multistage logic circuit, in which case the detector outputs can be joined together, in particular hierarchically, by means of the logic circuit. This allows simple and low-complexity connection and evaluation of the output signals from the detector. Furthermore, the further logic circuit makes it possible to ensure flexible connection of the detector outputs, thus allowing an optimized circuit layout.

It is possible to provide for a first detector output and a second detector output from a memory cell block to be electrically connected to an AND gate.

The parallel-cascaded connection of the memory cell blocks to a number of memory cells and parity checking circuits in each case allows the circuitry to be designed flexibly, and allows a relatively space-saving circuit design.

One embodiment of the circuitry provides for the outputs of two adjacent AND gates to be electrically connected to the input of an OR gate, and for the output of the OR gate to be electrically connected to the input of a second OR gate. The parallel-cascaded connection allows the output signals from the detector outputs to be linked in a flexible, versatile manner. This allows a more flexible circuit design for the entire memory cell array, and thus involves less design complexity. Furthermore, these additional degrees of freedom make it possible to satisfy the requirement for a minimized space requirement and production costs which are as low as possible.

The foregoing summary has been provided only by way of introduction. Nothing in this section should be taken as a limitation on the following claims, which define the scope of the invention.

BRIEF DESCRIPTION OF THE DRAWINGS

A number of embodiments of the invention will be explained in more detail in the following text with reference to schematic circuit arrangements. In the figures.

Identical or functionally identical components are provided with the same reference symbols in the figures.

DETAILED DESCRIPTION OF THE DRAWINGS AND THE PRESENTLY PREFERRED EMBODIMENTS

Figure 1:
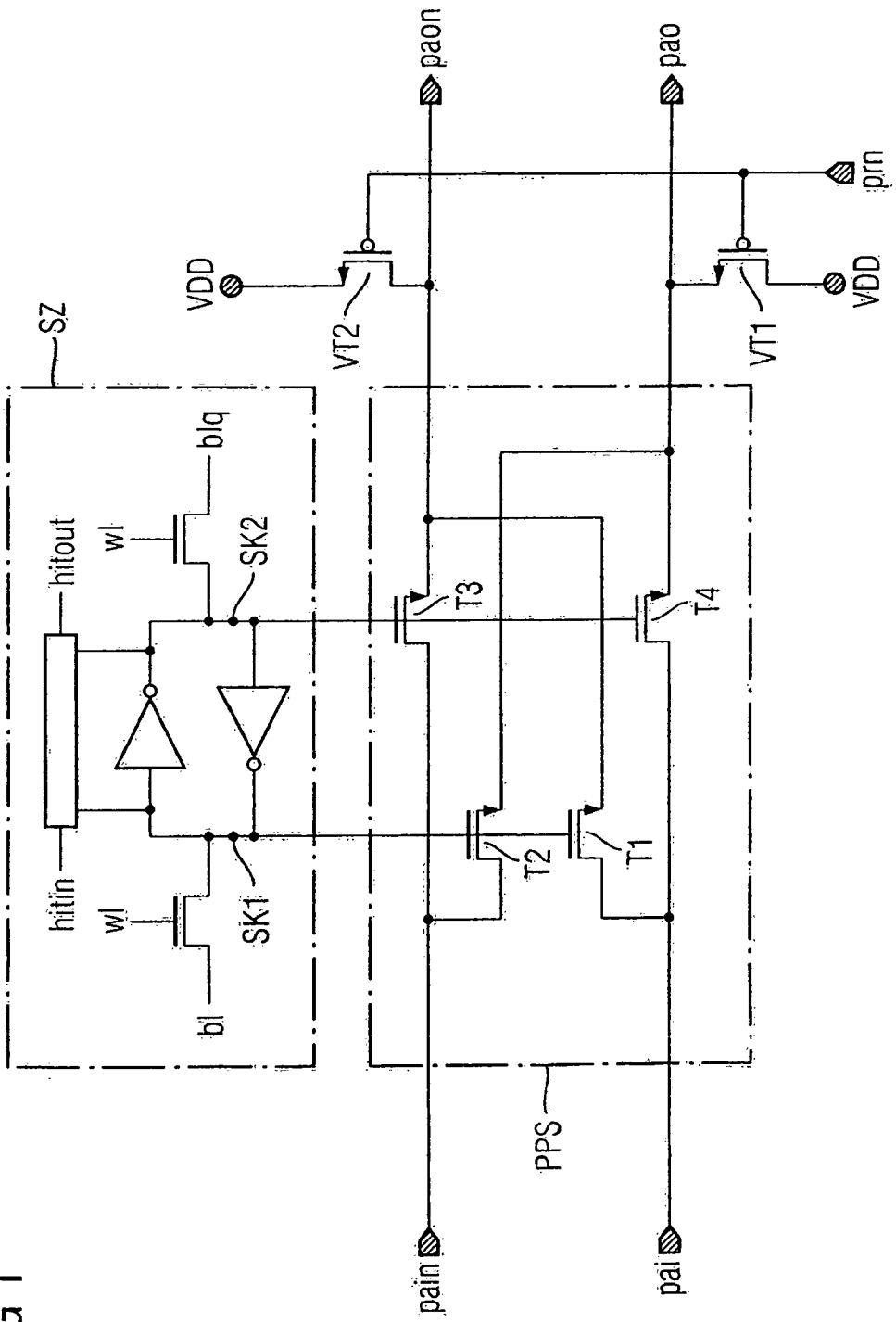
FIG. 1 shows a first embodiment of a parity checking circuit according to the invention.

FIG. 1 shows a first embodiment of a parity checking circuit. The parity checking circuit PPS makes contact with a memory cell SZ, which in the embodiment is a content-addressable memory cell, via two electrical connections. The memory cell SZ has two cross-coupled inverters. Furthermore, the memory cell SZ has two selection transistors, whose gate connections are electrically connected to a word line wl. The current path through the first selection transistor is connected between a first memory node SK1 and a bit line bl. The current path through the second selection transistor is connected between a second memory node SK2 and a complementary bit line blq. Normally, a content-addressable memory cell is formed from two mutually associated SRAM blocks. When used in a CAM component, each row in the first SRAM block is electrically connected via a hit line or a selection line to a row (if arranged in rows and columns in the form of a matrix) in the second SRAM block. If the memory content of a row matches the search word, the word line of the second SRAM block is activated via the hit line. This comparison of the memory cell content for possible activation of the hit line is carried out by means of a comparator (not illustrated) in the memory cell SZ, which is electrically connected to the hit line (not illustrated) via the input "hitin" and the output "hitout".

The embodiments of the parity checking circuit PPS as illustrated in FIG. 1 has four n-channel transistors T1 to T4. The four transistors are cross-coupled and are in the form of an EXCLUSIVE-OR circuit (EXOR circuit). The gate connections of the first transistor T1 and of the second transistor T2 are electrically connected to the output and to the first memory node SK1 of the memory cell SZ. The gate connections of the third and of the fourth transistor T3 and T4, respectively, are connected to the second output and to the second memory node SK2 in the memory cell SZ. Furthermore, the current path through the fourth transistor T4 is connected between a first parity input pai and a first parity output pao, with the source connection of the fourth transistor T4 being electrically connected to the first parity input pai, and to the source connection of the first transistor T1. The current path through the third transistor T3 is connected between a second parity input, which in the embodiment is a complementary parity input pain, and a second parity output, which in the embodiment is a complementary parity output paon. The source connection of the third transistor T3 is in this case electrically connected to the complementary parity input pain, and the source connection of the second transistor T2.

Furthermore, the source connection of the first transistor T1 is electrically connected to the parity input pai (first parity input), and its drain connection is electrically connected to the complementary parity output paon (second parity output) and to the drain connection of the third transistor T3.

The source connection of the second transistor T2 is electrically connected to the complementary parity input pain (second parity input), and its drain connection is electrically connected to the first parity output pao and to the drain connection of the fourth transistor T4. The current path through the second transistor T2 is thus connected between the complementary parity input pain and the first parity output pao, and the current path through the first transistor T1 is connected between the first parity input pai and the complementary parity output paon. On the gate side, the four transistors T1 to T4 are driven by the two memory cell outputs from the memory cell SZ.

Furthermore, precharge transistors VT1 and VT2 are optionally connected in the first embodiment. The first precharge transistor VT1 is in the form of a p-channel transistor. Its gate connection is electrically connected to a complementary control line (precharge line) prn, its source connection is electrically connected to the supply voltage potential VDD, and its drain connection is electrically connected to the first parity output pao. In the embodiment, the second precharge transistor VT2 is likewise in the form of a p-channel transistor and its gate connection is electrically connected to the control line prn, its source connection is electrically connected to the complementary parity output paon (second parity output), and its drain connection is electrically connected to the supply voltage potential VDD. The two optional precharge transistors VT1 and VT2 are used for resetting the parity checking circuit PPS during a writing process to the memory cell SZ.

The memory cell SZ may be replaced by any memory cell. If the alternative memory cell used does not have both an inverting output and a non-inverting output, the missing complementary signal is produced locally by an inverter.

Figure 2:
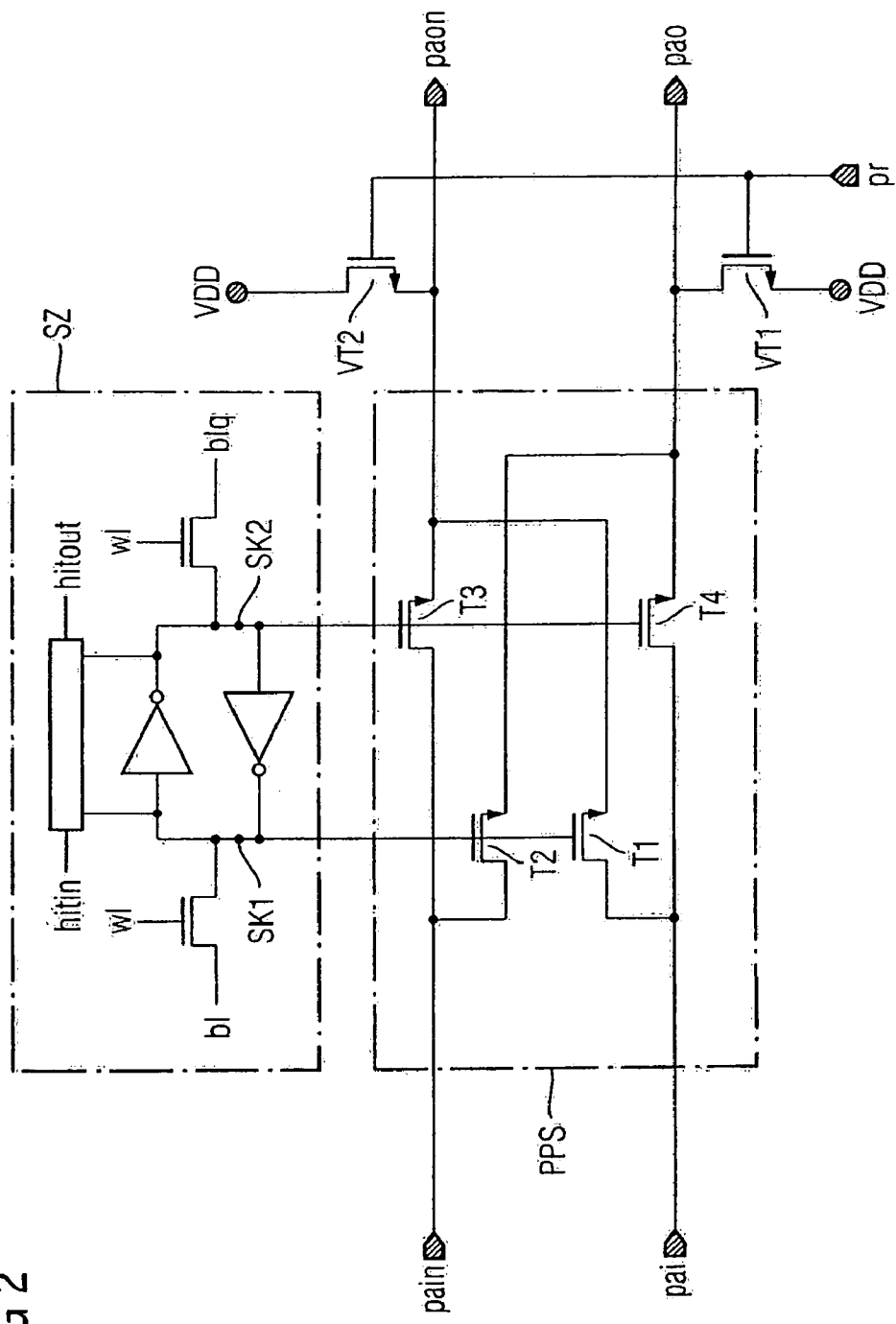
FIG. 2 shows a second embodiment of the parity checking circuit according to the invention.

FIG. 2 shows a further embodiment, in which, in contrast to the embodiment shown in FIG. 1, the precharge transistors VT1 and VT2 are in the form of n-channel transistors. The gate connections of the transistors VT1 and VT2 are respectively electrically connected to a control line and to a precharge line pr. The source connection of the first precharge transistor VT1 is electrically connected to the first parity output pao, and its drain connection is electrically connected to the supply voltage potential VDD. The source connection of the second precharge transistor VT2 is electrically connected to the supply voltage potential VDD, and its drain connection is electrically connected to the complementary parity output paon of the parity checking circuit PPS and/or the complementary parity output node paon.

It should be noted that the choice of the conductance type of the precharge transistors VT1 and VT2 is not dependent on the conductance type chosen for the four transistors T1 to T4 in the parity checking circuit. The precharge transistors VT1 and VT2 which are illustrated in the embodiments in FIG. 1 and FIG. 2 may also be omitted if there are no time problems in calculation of the parity information over a sufficiently large number of series transistors for the respective application. It should also be noted that the parity checking circuits PPS shown in FIGS. 1 and 2 may, instead of the standard form with n-channel transistors T1 to T4, be replaced with a complementary implementation by means of p-channel transistors T1 to T4. In this case, the optional precharge transistors VT1 and VT2 are connected to ground potential VSS.

Figure 3:
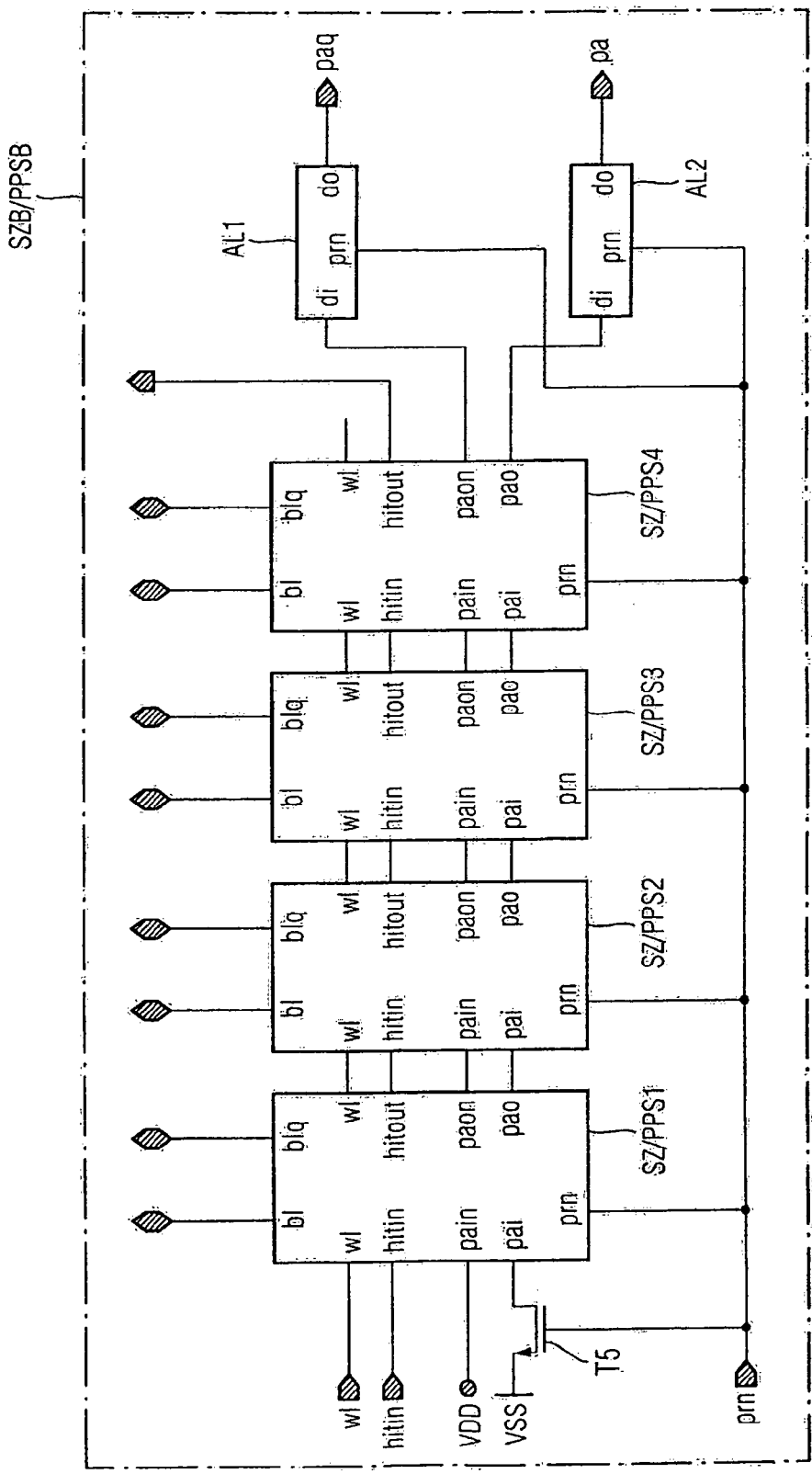
FIG. 3 shows a first embodiment of circuitry of memory cells which are arranged in a row of a memory cell array and each have a parity checking circuit according to the invention.

FIG. 3 shows a first embodiment of a connection of memory cells SZ arranged in a row of a memory cell array. A memory cell and the associated parity checking circuit PPS are symbolized in a simplified form by the reference symbol SZ/PPS in a schematic block diagram. The embodiment in FIG. 3 shows a row with four combined memory cells/parity checking circuits SZ/PPS1 to SZ/PPS4 as a detail of a memory cell array in which the memory cells are arranged in the form of a matrix. The first memory cell SZ/PPS1 in the row is electrically connected by means of its first parity input pai to ground potential VSS, and by means of its complementary parity input pain (second parity input) to the supply voltage potential VDD. The electrical connection of the first parity input pai to the ground potential VSS is passed via the current path through a transistor T5 which, in the embodiment, is in the form of an n-channel transistor and whose source connection is electrically connected to the first parity input of the first memory cell SZ/PPS1, while its gate connection is electrically connected to a complementary control line or precharge line prn. The transistor T5 is used for parallel current disconnection for as long as a parity checking circuit PPS has been reset by means of a logic signal level "LOW" applied to the complementary control line or precharge line prn.

The first parity output pao and the complementary parity output paon (second parity output) of the first memory cell SZ/PPS1 are electrically connected to the first parity input pai and, respectively, to the complementary parity input pain of the second memory cell SZ/PPS2. The parity inputs and the parity outputs of the third memory cell SZ/PPS3 and of the fourth memory cell SZ/PPS4 are electrically connected in an analogous manner to the respective upstream and downstream memory cells. The last memory cell SZ/PPS4 is electrically connected by means of the complementary parity output paon to an input di of a first catch latch AL1. Furthermore, the first parity output pao of the fourth memory cell SZ/PPS4 is electrically connected to an input di of a second catch latch AL2. Both the four memory cells SZ/PPS1 to SZ/PPS4 and the two catch latches AL1 and AL2 are electrically connected to the complementary control line or precharge line prn. The output signal paq (complementary signal) at the output do of the first catch latch AL1, and the output signal pa at the output do of the second catch latch AL2 are passed to an AND gate, which is not illustrated. In the embodiment shown in FIG. 3, the memory cells with the parity checking circuit PPS correspond to FIG. 1, with p-channel transistors as precharge transistors.

Figure 4:
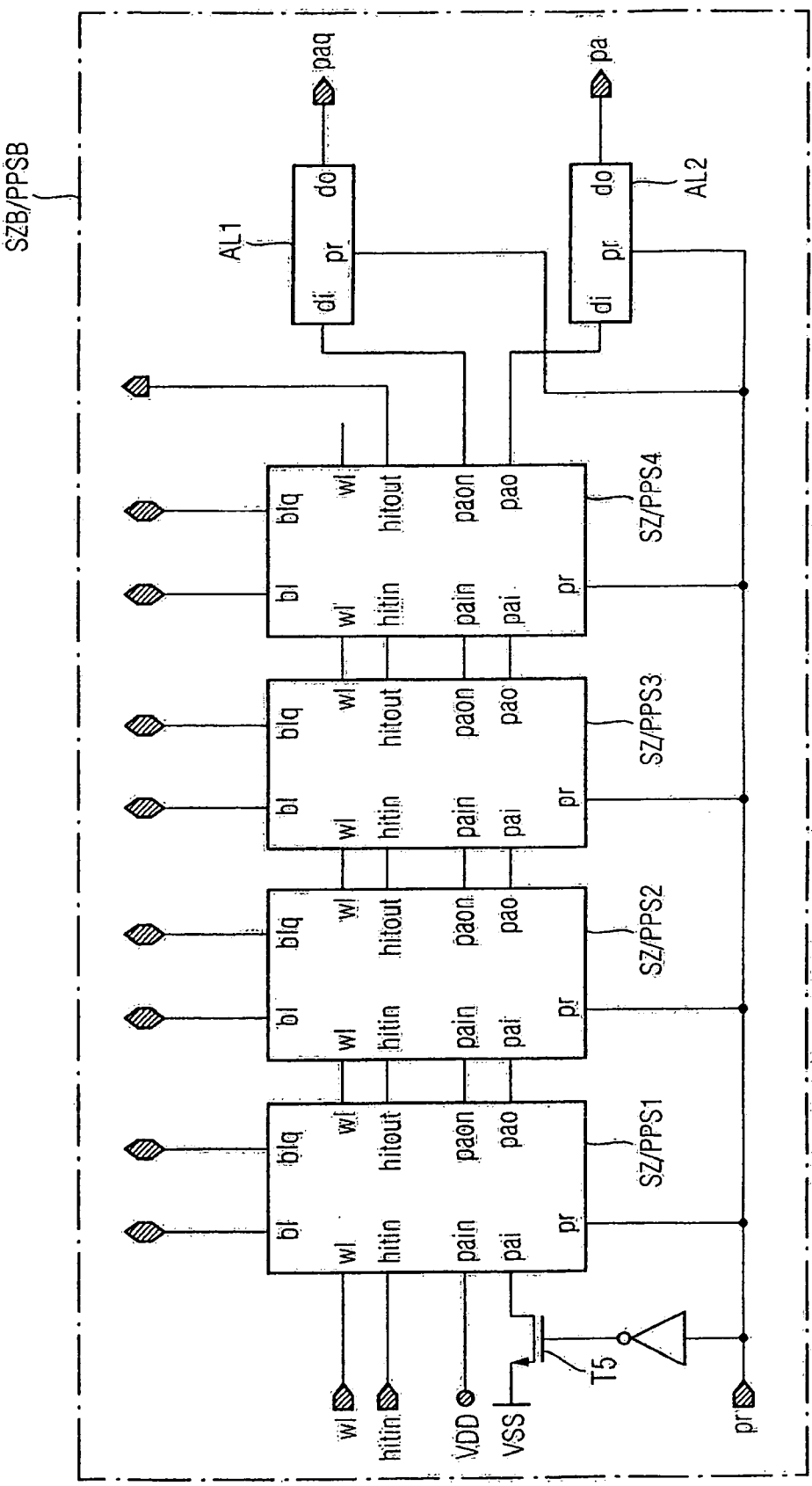
FIG. 4 shows a second embodiment of circuitry of memory cells which are arranged in a row of a memory cell array and each have a parity checking circuit according to the invention.

FIG. 4 shows a second embodiment of a connection of memory cells SZ arranged in one row of a memory cell array. In contrast to the illustration shown in FIG. 3, the memory cells correspond to FIG. 2, with n-channel transistors as precharge transistors VT1 and VT2. The control line or precharge line pr is electrically connected to the memory cells SZ/PPS1 to SZ/PPS4, and to the two catch latches AL1 and AL2. Furthermore, the control line pr is electrically connected to the gate connection of the transistor T5 via an inverter. Both the arrangement in FIG. 3 and that in FIG. 4 may be described as a memory cell block with parity checking circuits SZB/PPSB. The embodiment in FIG. 4 shows a memory cell block SZB/PPSB which has four series-connected memory cells with corresponding parity checking circuits SZ/PPS1 to SZ/PPS4. A memory cell block SZB/PPSB may, however, also have more or less—but at least two—memory cells SZ/PPS. The memory cell block SZB/PPSB has a first detector output pa and a second detector output paq, with the first detector output pa being electrically connected to the output do of the second catch latch AL2, and the second detector output paq being electrically connected to the output do of the first catch latch AL1.

Figure 5:
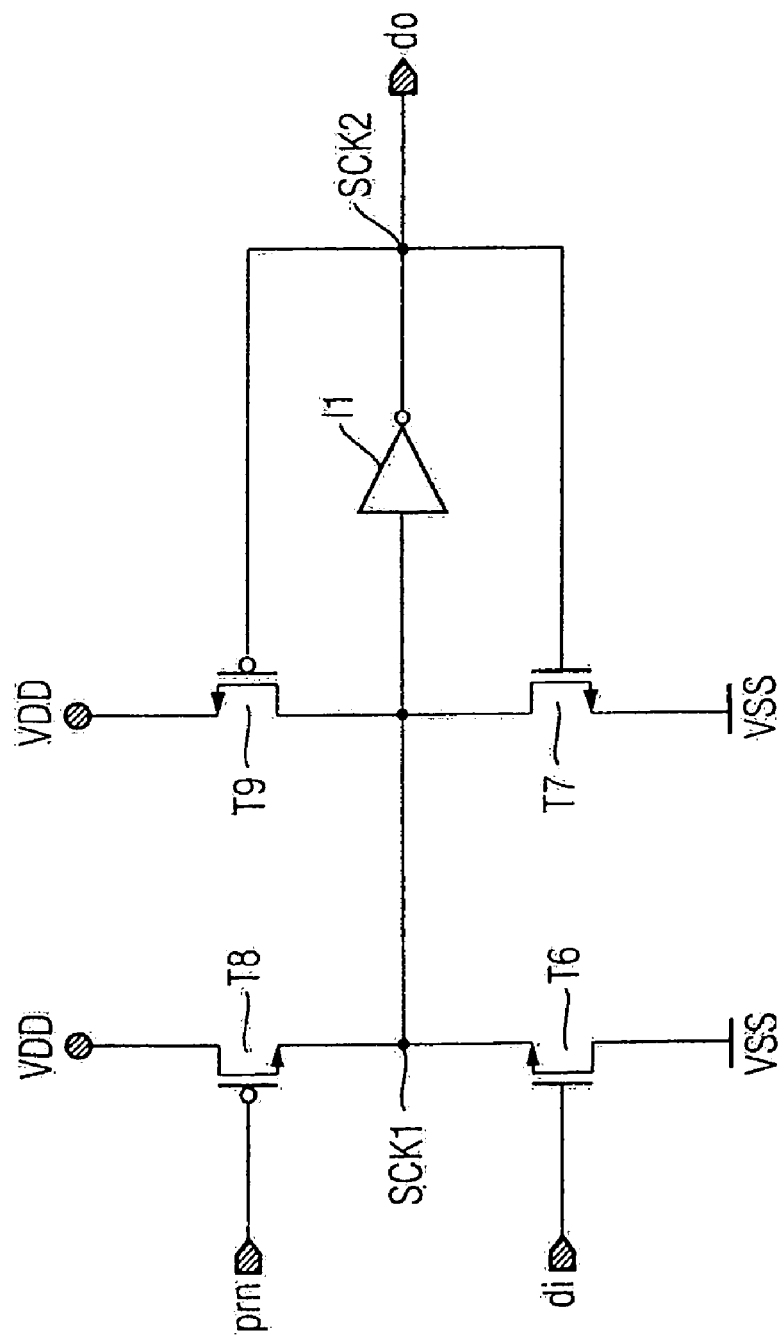
FIG. 5 shows a first embodiment of a catch latch.

FIG. 5 shows a first embodiment of a catch latch AL1 or AL2. The two catch latches AL1 and AL2 are designed in the same way in terms of circuitry. A catch latch as shown in FIG. 5 has four transistors T6 to T9. The transistors T6 and T7 are n-channel transistors. The gate connection of the transistor T6 is electrically connected to the input di, its source connection is electrically connected to ground potential VSS, and its drain connection is electrically connected to a first circuit node SCK1 of the catch latch. The drain connection of the second transistor T7 is connected to ground potential VSS. The source connection of the transistor T7 is electrically connected to a first circuit node SCK1, and its gate connection is electrically connected to a second circuit node SCK2. Furthermore, a catch latch has a third transistor T8 and a fourth transistor T9, which, in the embodiment, are in the form of p-channel transistors. The gate connection of the transistor T8 is electrically connected to the complementary precharge line or control line for resetting the parity checking circuit PPS, its source connection is electrically connected to the supply voltage connection VDD, and its drain connection is electrically connected to the first circuit node SCK1. The gate connection of the fourth transistor T9 is electrically connected to the second circuit node SCK2, its source connection is electrically connected to the first circuit node SCK1, and its drain connection is electrically connected to the supply voltage potential VDD.

Furthermore, the catch latch as shown in FIG. 5 has a first inverter I1, whose input is electrically connected to the first circuit node SCK1 and whose output is also electrically connected to the output do of the catch latch via the second circuit node SCK2.

The method of operation of the catch latch AL1 or AL2 will be explained in the following text with reference to the illustration in FIG. 3. As soon as a process of writing to the memory cells SZ/PPS has been completed, the signal on the complementary control line prn is set to the logic level "HIGH" (the detector has, for example, assumed the initialization state "00"). The assessment of the parity path then starts. Once the parity for one data word has been calculated for the first time completely, one, and only one, of the two catch latches AL1 or AL2 is set to produce the logic level "HIGH" at its output, depending on the data content. Valid combinations at the outputs pao-and paon are the logic states "01" and "10", respectively (examples of detector state classes for normal operation). Error identification is thus possible by means of the logic "AND" operation on the output pa and the complementary output paq from the two catch latches AL1 and AL2, since each short-term change in a data bit also sets the second parity latch or catch latch irreversibly to the logic level "HIGH" (detector state class error). The already explained method of operation for the catch latch illustrated in FIG. 4 is analogous, with the control signal pr being set to the logic level "LOW" there.

Figure 6:
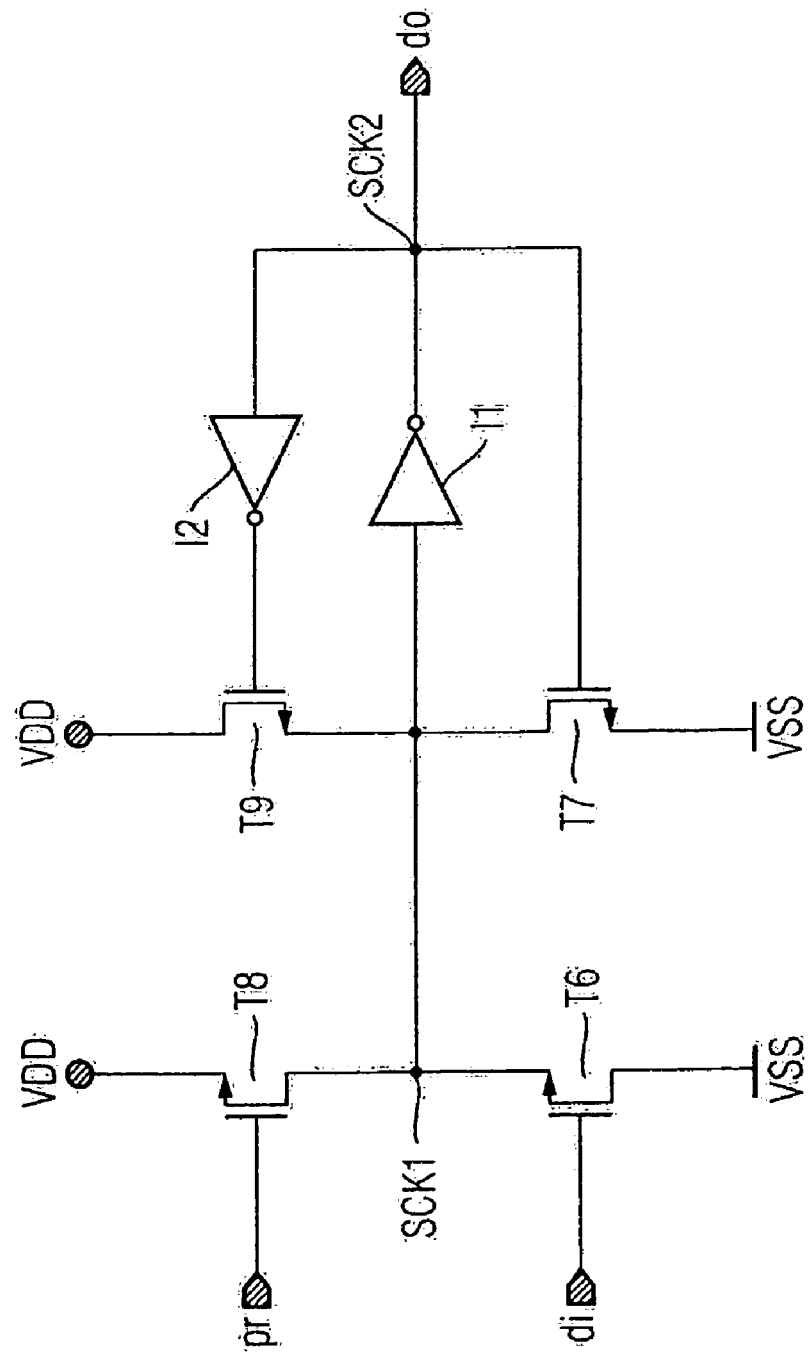
FIG. 6 shows a second embodiment of a catch latch.

FIG. 6 shows a second embodiment of a catch latch. In contrast to the embodiment shown in FIG. 5, the transistors T8 and T9 are in this case in the form of n-channel transistors. The gate connection of the transistor T8 is electrically connected to the control line pr, the source connection is electrically connected to the first circuit node SCK1, and the drain connection is electrically connected to the supply voltage potential VDD. Furthermore, the source connection of the transistor T9 is electrically connected to the supply voltage potential VDD, and its drain connection is electrically connected to the second circuit node SCK2. The gate connection of the transistor T9 is electrically connected to the output of a second inverter I2, with the input of the second inverter I2 being electrically connected to the second circuit node SCK2. In comparison to the embodiment shown in FIG. 5, the embodiment shown in FIG. 6 shows a variant with reduced levels.

For higher-performance applications, the parity checking chain may also be in a parallel, cascaded form. This is illustrated by way of example in FIGS. 7 and 8, which show possible connections for parity checking chains such as these, for 4-bit data word elements, by way of example.

Figure 7:
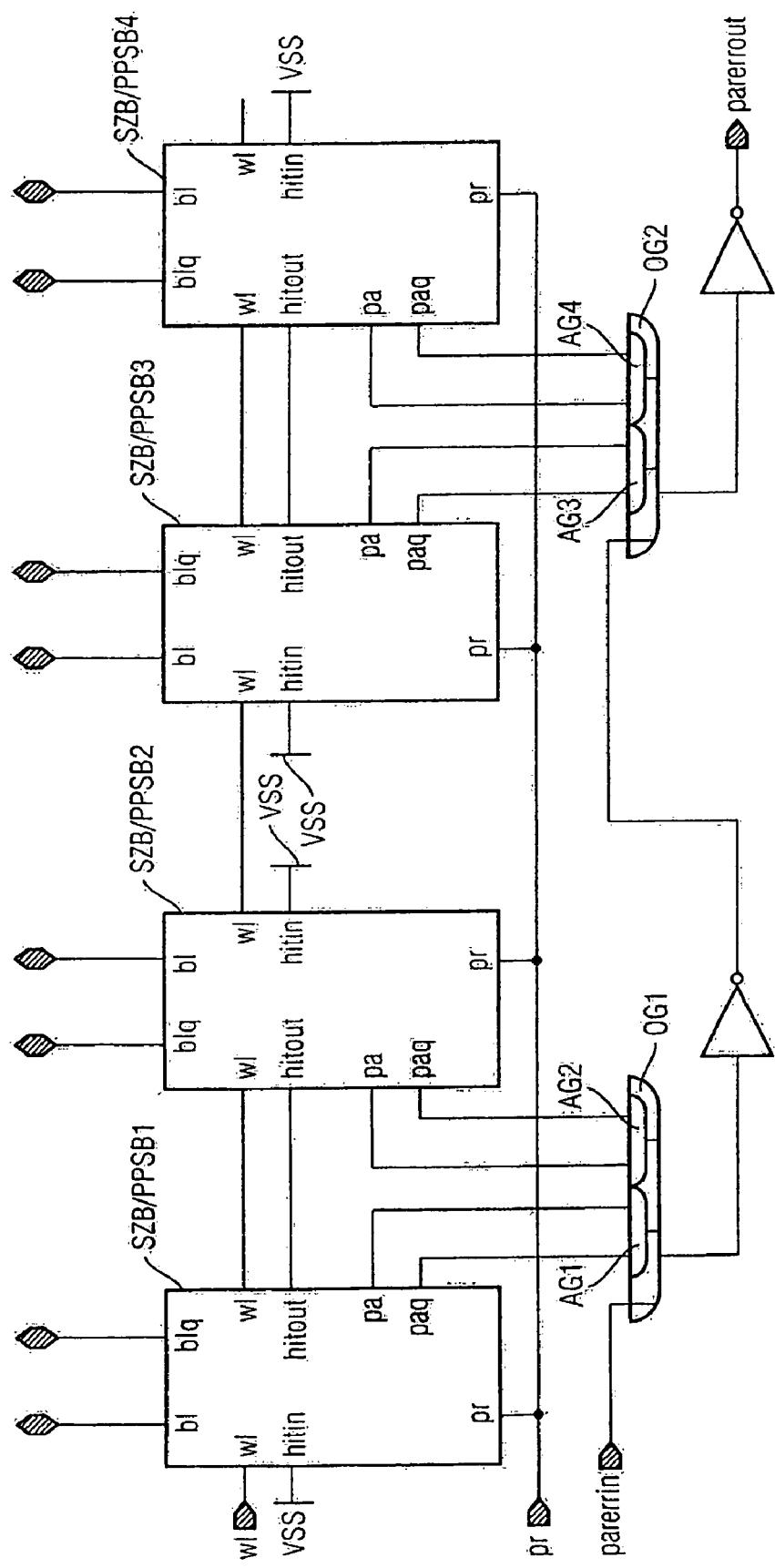
FIG. 7 shows a first embodiment of parallel-cascaded parity outputs of memory cell blocks in a memory cell array.

The embodiment shown in FIG. 7 has four memory cell blocks with the corresponding parity checking circuits with catch latches SZB/PPSB1 to SZB/PPSB4. Each of these memory cell blocks SZB1/PPSB1 to SZB/PPSB4 may, for example, be designed in a corresponding manner to the memory cell block SZB/PPSB shown in FIG. 4. In this embodiment, which is shown in FIG. 7, the first detector output pa and the detector output paq of the first memory cell block SZB/PPSB1 are electrically connected to a first AND gate AG1 in order to carry out a logic "AND" operation on the two signals. Furthermore, the first detector output pa and the detector output paq of the second memory cell block SZB/PPSB2 are electrically connected to a second AND gate AG2. The outputs of the two AND gates AG1 and AG2 are electrically connected to a first OR gate OG1. Furthermore, a parity error signal "parerrin" is applied to this OR gate OG1 and may be the output signal from an upstream OR gate. This parity error signal is permanently connected to the logic state "0" in the unused state, in order that the output of the OR gate is not influenced. The signal which results from the OR logic operation in the first OR gate OG1 is passed as an output signal to a second OR gate OG2, with the OR gates OG1 and OG2 being connected in series. The second OR gate OG2 is designed analogously to the first OR gate OG1 and, in addition to the output signal from the first OR gate OG1, logically links the logic output signals from a third and fourth AND gate AG3 and AG4, respectively. The AND gate AG3 carries out a logic "AND" operation on the signals which are produced at the detector output pa and at the detector output paq of the third memory cell block SZB/PPSB3. Corresponding output signals from the fourth memory cell block SZB/PPSB4 are processed analogously in the AND gate AG4.

Figure 8:
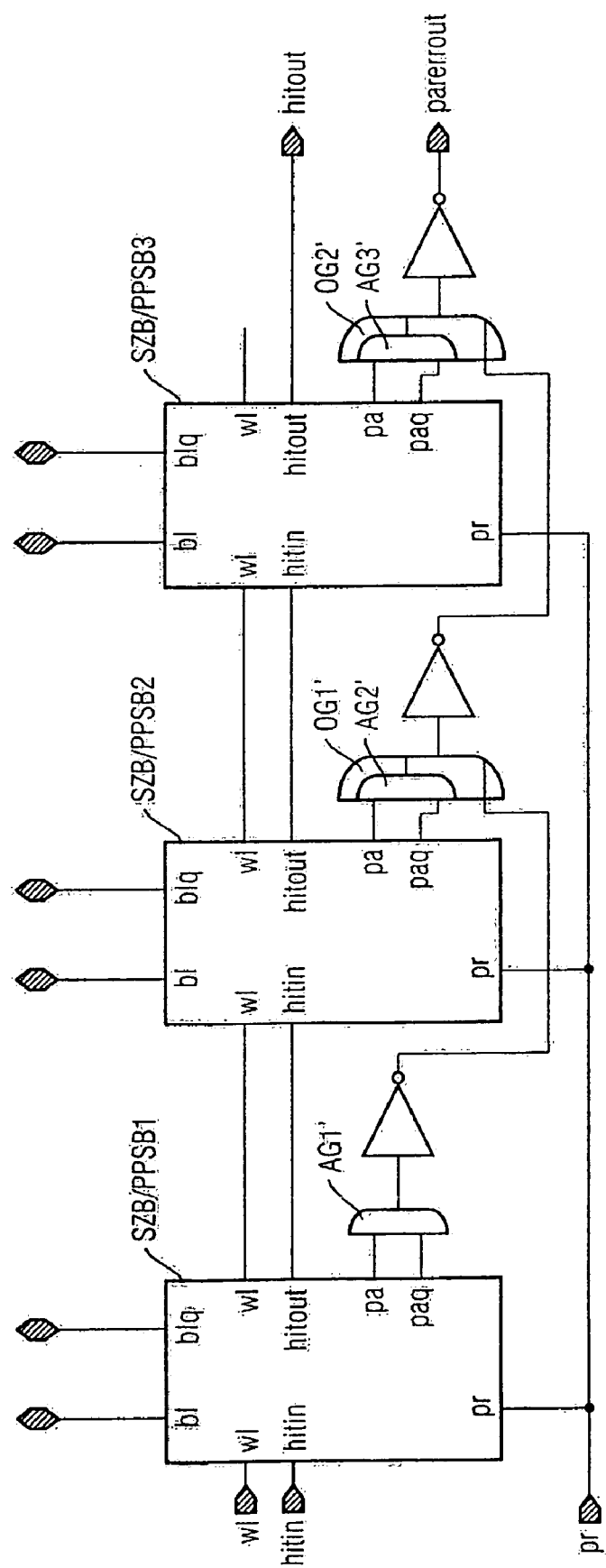
FIG. 8 shows a second embodiment of parallel-cascaded parity outputs of memory cell blocks in a memory cell array.

FIG. 8 shows a further embodiment of a parallel-cascaded embodiment, in which three memory cell blocks SZB/PPSB1 to SZB/PPSB3 are shown. The memory cell blocks SZB/PPSB1 to SZB/PPSB3 may each be designed in a corresponding manner to the memory cell block shown in FIG. 4. In this embodiment shown in FIG. 8, the output signals from the detector output pa and from the detector output paq of the first memory cell block SZB/PPSB1 are logically "AND" linked in the AND gate AG1'. The output signal from this AND gate AG1' is applied to a first OR gate OG1'. Furthermore, the output signal from the second AND gate AG2' is processed by the first OR gate OG1'. The second AND gate AG2' logically links the output signals from the detector output pa and from the detector output paq of the second memory cell block SZB/PPSB2 by means of a logic "AND" operation. The corresponding output signals from the third memory cell block SZB/PPSB3 are processed in the third AND gate AG3' in a corresponding manner. The output signal from the third AND gate AG3' and the output signal from the first OR gate OG1' are passed to the second OR gate OG2', where they are logically "OR" linked in a further stage in the parity checking chain. OR gates OG1 and OG2 are in this case once again connected in series. The parity error signal is characterized by the output signal "parerrout" from the last OR gate in the chain at the end of such cascaded parity checking. The versions of parallel-cascaded parity checks shown in FIGS. 7 and 8 are only by way of example, and may be embodied in many ways.

As the embodiments in FIGS. 7 and 8 show, the two latch output bit pairs are each in general logically linked by an AND gate and are then joined together, either in parallel form or alternatively in serial form, by means of one or more OR logic operations to form an error bit at the word level. This allows deliberate correction or rewriting of the corrupted data word. The error bits in individual data words can then also be joined together in a similar manner for an entire memory cell array, as required, although this results in the information about the error location becoming less accurate.

The parity checking circuit is designed such that continuous parity checking can be carried out without previous external calculation and storage of additional parity checking bits. The parity checking can be carried out effectively and reliably without increasing the payload data word length, since the parity checking circuit makes it possible for the number of parity checking stages per data word during parity checking to be equal to the number of bits in the original payload data word to be stored. For reliable and fast continuous parity checking of memory cells in a data storage apparatus, in particular a memory cell array having a number of memory cells, the parity checking circuit uses just four transistors, which are of the same conductance type, so that the layout and the production can be considerably simplified and made more cost-effective. The space saving in comparison to a parity checking circuit which is known from the prior art is thus about 50%, thus making it possible to achieve a considerable saving in terms of chip area. In addition to this reduced number of components, the optimized connection of the components in the parity checking circuit itself, together with the external electrical connections, allow a considerably improved design in terms of reliable assessment and error identification for the memory bits in the memory cells. The parity checking circuit may be used with content-addressable memory cells, which are used in particular as cache memories, or for configuration memories for coefficients of filter modules.

On-line parity checking is provided by the detector which in general detects the change in an information state dynamically, in particular in two steps, and carries out the calculation of the parity checking information automatically, without this parity checking information having to be calculated and stored externally in advance. This detector may preferably be designed such that, as an automatic state device, it has three state classes, with the first state class representing initialization, a second state class representing normal operation, and a third state class being characterized by an error state. In particular, the detector may be irreversible. This means that, when a change takes place from one state class to another, for example from initialization to normal operation or from normal operation to a fault state, it is not possible to change back to the previous state class without an external reset control signal.

Furthermore, logic is designed to follow the detector (which, in particular, is in the form of catch latches), and reduces the output signal from the detector to a 1-bit signal.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

The invention claimed is:

1. A parity checking system for continuous parity checking of memory cells of a memory cell array configured to store an original payload data word of M bits, comprising:
    a plurality of parity checking circuits, where each parity checking circuit is connected to a corresponding memory cell of the memory cell array and configured to continuously check a parity of the corresponding memory cell, each parity checking circuit comprising:
        a first parity input and a second parity input;
        a first parity output and a second parity output;
        a first transistor connected between the first parity input and the second parity input;
        a second transistor connected between the second parity input and the first parity output;
        a third transistor connected between the second parity input and the second parity output;
        a fourth transistor connected between the first parity input and the first parity output;
        where each of the first, second, third, and fourth transistors comprise a gate connected to a memory cell of the memory cell array; and
        where each of the first, second, third, and fourth transistors comprise the same conductance type; and
    where the number N of parity checking circuits in the plurality of parity checking circuits equals the number M of bits in the original payload data word.

2. The parity checking system of claim 1, where each of the first, second, third, and fourth transistors comprise the same conductance type.

3. The parity checking system of claim 1, where the gates of the first and second transistors are connected to a first memory node of the memory cell and the gates of the third and fourth transistors are connected to a second memory node of the memory cell.

4. The parity checking system of claim 1, further comprising a precharge circuit connected to the first and second parity outputs.

5. The parity checking system of claim 4, where the precharge circuit comprises:
    a precharge line input;
    a first precharge transistor comprising:
        a source connected to the first parity output; and
        a drain connected to a voltage source potential;
    a second precharge transistor comprising:
        a source connected to the voltage source potential; and
        a drain connected to the second parity output; and
    where first and second precharge transistors each comprise a gate connected to the precharge line input.

6. The parity checking circuit of claim 5, where each of the first, second, third, and fourth transistors comprise a first conductance type, and each of the first and second precharge transistors comprise a second conductance type opposite to the first conductance type.

7. The parity checking system of claim 6, where the precharge line input comprises a complementary control line input.

8. The parity checking system of claim 5, where the first and second parity outputs each comprise an electrical connection to a detector that detects a change in an information state of the memory cell.

9. The parity checking system of claim 8, where the detector comprises an automatic state device that comprises:
    a first state class that characterizes an initialization state;
    a second state class that characterizes normal operation; and
    a third state class that characterizes a fault.

10. The parity checking system of claim 9, where a state class change is irreversible.

11. The parity checking system of claim 8, where the detector comprises a first catch latch and a second catch latch.

12. The parity checking system of claim 11, where each of the first and second catch latches comprise:
    a latch input;
    a latch output;
    a first inverter comprising a first inverter input and a first inverter output;
    a first circuit node connected to the first inverter input;

a second circuit node connected to the inverter output and to the latch output;
a first latch transistor comprising:
a gate connected to the latch input;
a drain connected to the first circuit node; and
a source connected to a ground potential;
a second latch transistor comprising:
a gate connected to the second circuit node;
a drain connected to the ground potential; and
a source connected to the first circuit node; and
where the first and second latch transistors each comprise a first conductance type.

13. The parity checking system of claim 12, where each catch latch further comprises:
a complementary control line input;
a third latch transistor comprising:
a gate connected to the complementary control line input;
a drain connected to the first circuit node; and
a source connected to a supply voltage potential;
a fourth latch transistor comprising:
a gate connected to the second circuit node;
a drain connected to the supply voltage potential; and
a source connected to the first circuit node; and
where the third and fourth transistors each comprise a second conductance type opposite to the first conductance type.

14. The parity checking system of claim 12, where each catch latch further comprises:
a control line input;
a second inverter comprising:
a second inverter input connected to the second circuit node; and
a second inverter output;
a third latch transistor comprising:
a gate connected to the control line input;
a drain connected to a supply voltage potential; and
a source connected to the first circuit node;
a fourth latch transistor comprising:
a gate connected to the second inverter output;
a drain connected to the first circuit node; and
a source connected to the supply voltage potential; and
where the third and fourth transistors each comprise a second conductance type that is the same as the first conductance type.

15. The parity checking system of claim 8, where the detector comprises a first output providing a first output signal and a second output providing a second output signal, and where the first and second outputs are connected to inputs of a logic circuit configured to reduce the first and second output signals to a 1-bit signal.

16. The parity checking system of claim 15, where the logic circuit comprises an AND gate.

17. The parity checking system of claim 1, where the first, second, third, and fourth transistors are cross-coupled.

18. The parity checking system of claim 1, where a source connection of the first transistor is connected to a source connection of the fourth transistor, a source connection of the second transistor is connected to a source connection of the third transistor, and a drain connection of the second transistor is connected to a drain connection of the fourth transistor, and a drain connection of the first transistor is connected to a drain connection of the third transistor.

19. The parity checking system of claim 1, where:
the first transistor comprises:
a source connected to the first parity input; and
a drain connected to the second parity output; and
the second transistor comprises:
a source connected to the second parity input; and
a drain connected to the first parity output.

20. The parity checking system of claim 1, where:
the third transistor comprises:
a source connected to the second parity input; and
a drain connected to the second parity output; and
the fourth transistor comprises:
a source connected to the first parity input; and
a drain connected to the first parity output.

* * * * *